(12) United States Patent
Yuan et al.

(10) Patent No.: US 9,519,745 B2
(45) Date of Patent: Dec. 13, 2016

(54) METHOD AND APPARATUS FOR ASSISTED METAL ROUTING

(71) Applicant: GLOBALFOUNDRIES Inc., Grand Cayman (KY)

(72) Inventors: Lei Yuan, Cupertino, CA (US); Irene Lin, Los Altos Hills, CA (US); Jongwook Kye, Pleasanton, CA (US); Mahbub Rashed, Cupertino, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/523,558

(22) Filed: Oct. 24, 2014

(65) Prior Publication Data

US 2016/0117432 A1    Apr. 28, 2016

(51) Int. Cl.
*G06F 17/50* (2006.01)
(52) U.S. Cl.
CPC ....... *G06F 17/5081* (2013.01); *G06F 17/5077* (2013.01)
(58) Field of Classification Search
CPC .............. G03F 7/70425; G03F 7/70466; G06F 17/5077
See application file for complete search history.

(56) References Cited

U.S. PATENT DOCUMENTS

2014/0208285 A1* 7/2014 Kye .................... G06F 17/5081
716/126

OTHER PUBLICATIONS

Ben et al., "Layout Decomposition of Self-Aligned Double Patterning for 2D Random Logic Patterning". Proceedings of SPIE vol. 7974, 2011.*

* cited by examiner

*Primary Examiner* — Vuthe Siek
*Assistant Examiner* — Aric Lin
(74) *Attorney, Agent, or Firm* — Ditthavong & Steiner, P.C.

(57) ABSTRACT

A method and apparatus for an assisted metal routing is disclosed. Embodiments may include: determining an initial block mask having a first inner vertex for forming a metal routing layer of an integrated circuit (IC); adding an assistant metal portion within the metal routing layer; and determining a modified block mask based on the assistant metal portion for forming the metal routing layer.

10 Claims, 10 Drawing Sheets

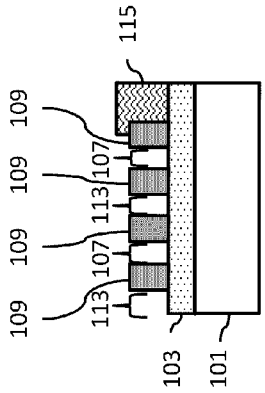
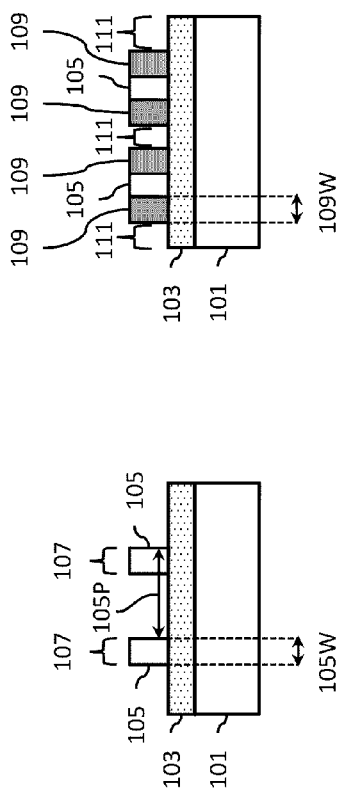
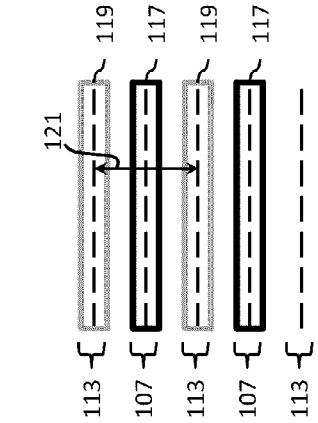
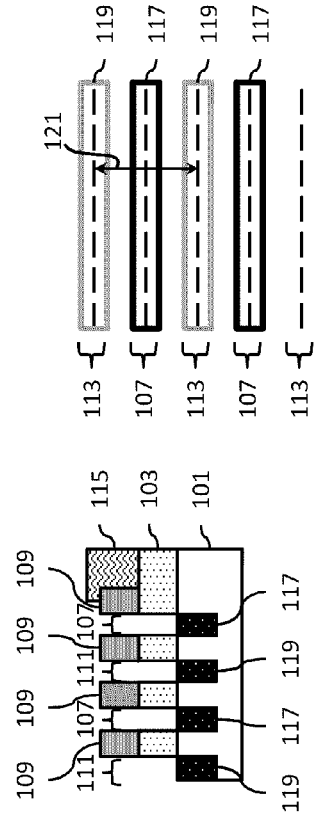
FIG. 1A BACKGROUND ART
FIG. 1B BACKGROUND ART
FIG. 1C BACKGROUND ART
FIG. 1D BACKGROUND ART
FIG. 1E BACKGROUND ART

METHOD AND APPARATUS FOR ASSISTED METAL ROUTING

TECHNICAL FIELD

The present disclosure relates to interconnect routing for high performance cells within an integrated circuit (IC). The present disclosure is particularly applicable to interconnect design and routing for 10 nanometers (nm) technology nodes and beyond.

BACKGROUND

Desired device dimensions and pitches have decreased to the point where traditional single patterning photolithographic techniques (e.g., 193 nm wavelength photolithography) cannot form a single patterned mask layer with all of the features of the final target pattern. Thus, device designers and manufacturers have begun utilizing various double patterning techniques, such as self-aligned double patterning (SADP). However, block masking in SADP adversely impacts metal routing because of inner vertex (or inner corner) rounding. In particular, block masking requires enforcement of minimum distances with respect to line ends.

A need therefore exists for a methodology and a corresponding apparatus legalizing routing configurations adversely impacted by inner corner rounding.

SUMMARY

An aspect of the present disclosure is a method for legalizing a routing configuration based on an assisted metal routing.

Another aspect of the present disclosure is an apparatus configured to legalize a routing configuration based on an assisted metal routing.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining an initial block mask having a first inner vertex for forming a metal routing layer of an IC; adding an assistant metal portion within the metal routing layer; and determining a modified block mask based on the assistant metal portion for forming the metal routing layer.

Aspects of the present disclosure include determining a routing violation associated with the first inner vertex of the initial block mask, wherein the adding of the assistant metal portion is based on the routing violation. Further aspects include the routing violation being based on one or more of a keep out rule, a vertical interconnect access (VIA) enclosure rule, and a minimum feature size for block masking. Additional aspects include determining a first line end of the metal routing layer, wherein the first inner vertex of the initial block mask corresponds to forming the first line end. Further aspects include determining a first VIA connection to the metal routing layer at the first line end, wherein the modified block mask satisfies a routing violation of the metal routing layer with respect to the first VIA connection. Additional aspects include determining a second line end of the metal routing layer within a same track as the first line end; and determining a second VIA connection to the metal routing layer at the second line end, wherein the modified block mask satisfies a routing violation of the metal routing layer between the first VIA connection and the second VIA connection. Further aspects include the assistant metal portion being added to a metal track adjacent to the first line end. Additional aspects include modifying the metal routing layer to connect the assistant metal portion to routing lines of the metal routing layer.

Another aspect of the present disclosure is an apparatus including at least one processor and at least one memory including computer program code for one or more programs, the at least one memory and the computer program code configured to, with the at least one processor, cause the apparatus to: determine an initial block mask having a first inner vertex to form a metal routing layer of an IC; add an assistant metal portion within the metal routing layer; and determine a modified block mask based on the assistant metal portion for forming the metal routing layer.

Aspects include the apparatus being further caused to determine a routing violation associated with the first inner vertex of the initial block mask, wherein the adding of the assistant metal portion is based on the routing violation. Further aspects include the routing violation being based on one or more of a keep out rule, a VIA loop enclosure rule, and a minimum feature size for block masking. Additional aspects include the apparatus being further caused to determine a first line end of the metal routing layer, wherein the first inner vertex of the initial block mask corresponds to forming the first line end. Further aspects include the apparatus being further caused to determine a first VIA connection to the metal routing layer at the first line end, wherein the modified block mask satisfies a routing violation of the metal routing layer with respect to the first VIA connection. Additional aspects include the apparatus being further caused to determine a second line end of the metal routing layer within a same track as the first line end; and determine a second VIA connection to the metal routing layer at the second line end, wherein the modified block mask satisfies a routing violation of the metal routing layer between the first VIA connection and the second VIA connection. Another aspect includes the assistant metal portion being added to a metal track adjacent to the first line end. A further aspect includes the apparatus being further caused to modify the metal routing layer to connect the assistant metal portion to routing lines of the metal routing layer.)

Another aspect of the present disclosure is a method of metal routing, the method including: determining a configuration of a metal routing layer of an IC that would cause a routing violation; adding an assistant metal portion to the metal routing layer; and determining a block mask based on the assistant metal portion for forming the metal routing layer that satisfies the routing violation. Additional aspects include the routing violation being associated with a block mask inner vertex at an line end of the metal routing layer including a VIA connection. Further aspects include the routing violation being based on one or more of a keep out rule, a VIA enclosure rule, and a minimum feature size for block masking. Additional aspects include modifying the metal routing layer to connect the assistant metal portion to routing lines of the metal routing layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawings and in which like reference numerals refer to similar elements and in which:

FIGS. 1A through 1E schematically illustrate a conventional SADP process;

DETAILED DESCRIPTION

Figure 2A:
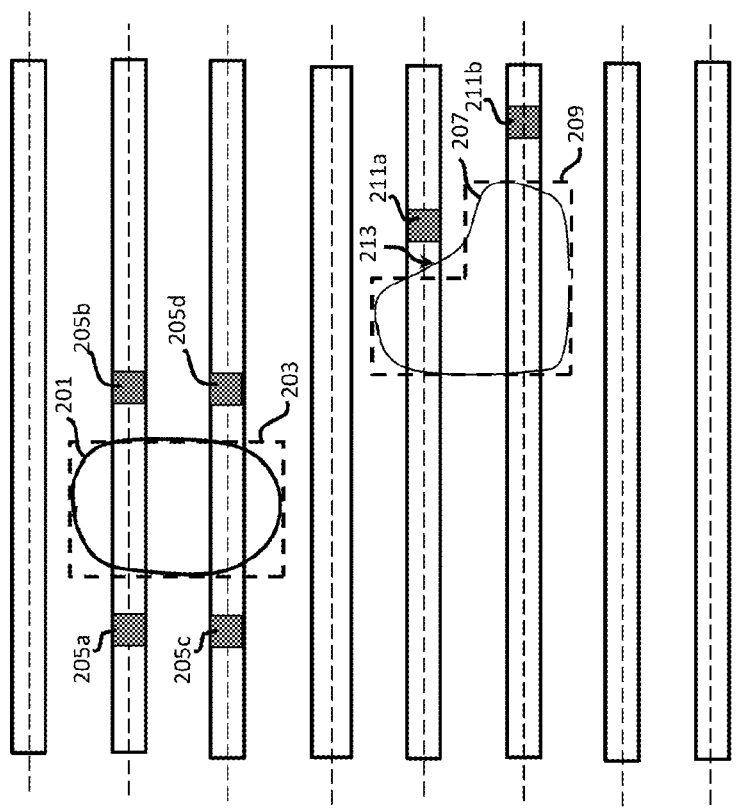
FIGS. 2A through 2C illustrate block masking rules for a conventional SADP process.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of routing limitations attendant upon metal routing for an SADP process. In accordance with embodiments of the present disclosure, a metal routing configuration is legalized by placement of an assistant metal portion.

Methodology in accordance with embodiments of the present disclosure includes determining an initial block mask having a first inner vertex for forming a metal routing layer of an IC, adding an assistant metal portion within the metal routing layer, and determining a modified block mask based on the assistant metal portion for forming the metal routing layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 1A through 1E schematically illustrate a conventional SADP process. FIG. 1A illustrates substrate 101 provided with hard mask 103 and mandrels 105. Mandrels 105 are formed by lithographic etching of a mandrel material. Mandrels 105 are placed on mandrel tracks 107 such that they have pitch 105P and minimum width 105W.

Adverting to FIG. 1B, spacers 109 are formed on each side of each of mandrels 105 such that they have width 109W. Spacers 109 may be formed by conformal deposition of a spacer material and selective etching. As shown, spacers 109 separate mandrels 105 from non-mandrel regions 111. Mandrels 105, spacers 109, and non-mandrel regions 111 may have equal widths.

Adverting to FIG. 1C, mandrels 105 are removed, resulting in self-aligning spacers 109 separating mandrel tracks 107 from non-mandrel tracks 113 that correspond to the non-mandrel regions 111. To protect one of non-mandrel tracks 113 during a subsequent metallization step, block mask 115 has been added in place of the rightmost non-mandrel track 113.

Adverting to FIG. 1D, mandrel metal routes 117 are formed in regions of substrate 101 formerly covered by mandrels 105 corresponding to the mandrel tracks 107. Non-mandrel metal routes 119 are formed in regions of substrate 101 corresponding to non-mandrel tracks 113. Mandrel metal routes 117 and non-mandrel metal routes 119 are placed in trenches formed by etching exposed portions of hard mask 103 down into substrate 101 directly below the exposed portions. As shown, spacers 109 and block mask 115 prevent etching of other portions of hard mask 103 and substrate 101.

FIG. 1E illustrates a gridding as may be used by an EDA tool for placement of the mandrel metal routes 117 and non-mandrel metal routes 119 corresponding to mandrel tracks 107 and non-mandrel tracks 113. Mandrel metal routes 117 are formed on mandrel tracks 107 and non-mandrel metal routes 119 are formed on non-mandrel tracks 113. As shown, the bottom non-mandrel track 113 is unused corresponding to the location of block mask 115 that was used to prevent formation of a metal route. The mandrel and non-mandrel metal routes have widths that correspond to widths 105W and 109W, respectively. Vertical spacing 121 between the tracks may be equal to metal pitch 105P.

Figure 2C:
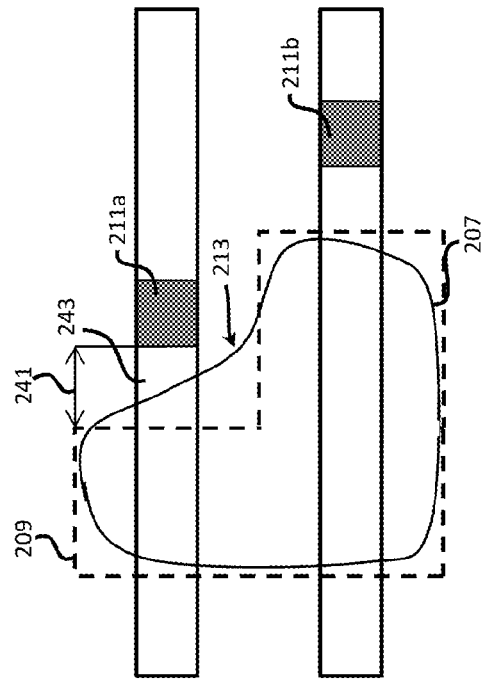
Figure 2B:
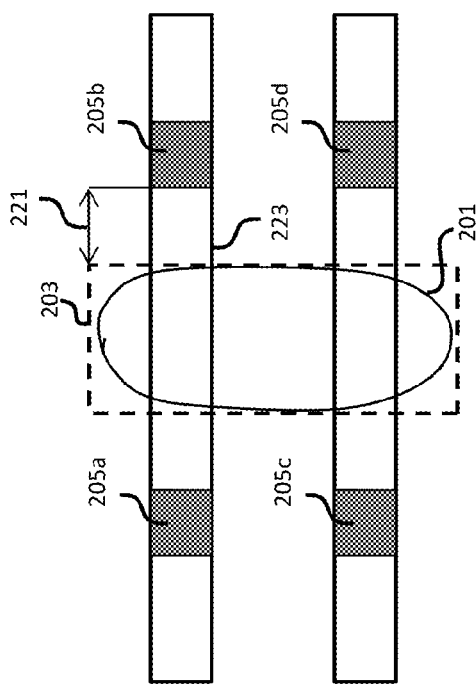

FIGS. 2A through 2C illustrate VIA enclosure rules for a conventional SADP process. SADP enforces minimum enclosure distances for VIAs connecting metal routes in adjacent metal layers. Process variations, such as metal line end pull back, overlay errors, and VIA size variation, cause a reduction of VIA metal overlap area leading to a partial connection or even open circuit. The enclosure distance varies depending on the shape of the block mask. The shape of the block mask for a particular configuration may vary based on the number and relative positions of the VIAs and/or line ends of a metal layer.

FIG. 2A illustrates block masks 201 and 207 used in a conventional SADP process. Block mask 201 lies within outline 203 and is used for forming line ends at VIAs 205a through 205d. With respect to block mask 207, however, block mask 207 extends beyond outline 209 in the vicinity of VIA 211a for forming line ends at VIAs 211a and 211b. As shown, the location at which block mask 207 extends beyond outline 209 corresponds to inner vertex 213. Because block masks extend beyond the desired areas at inner vertices, as discussed next in relation to FIGS. 2B and 2C, VIA enclosure rules require a different minimum length for the line ends that include VIA connections that are in close proximity to the inner vertices of block masks.

FIG. 2B illustrates an enlarged view of block mask 201. Length 221 of line end 223 between VIA 205b and block mask 201 must be sufficient to ensure the VIA connecting adjacent metal layers under process variations. The risk of block mask 201 extending beyond outline 203 is low because of the relative rectangular shape of block mask 201.

FIG. 2C illustrates an enlarged view of block mask 207. Length 241 of line end 243 between VIA 211a to block mask 207 must be sufficient to ensure VIA connecting adjacent metal layers. However, unlike block mask 201 in FIG. 2B, the risk of block mask 207 extending beyond outline 209 is greater because of the presence of inner vertex 213 and manufacturing conditions and process variations that cause block masks to extend beyond a desired boundary in the immediate vicinity of an inner vertex. Accordingly, a VIA enclosure rule for the SADP process enforces a larger distance for length 241 in FIG. 2B than length 221 in FIG. 2B.

In general, SADP processes enforce an additional margin for block masks with inner vertices to reliably accommodate VIA enclosures. A distance rule may be described as "loose" or "tight" depending on whether it enforces a longer or shorter VIA loop enclosure distance, respectively.

Figure 3:
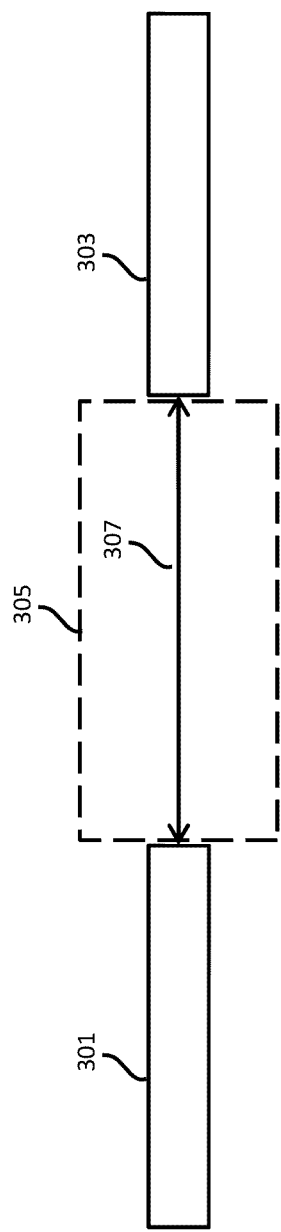
FIG. 3 illustrates the operation of a line end keep out rule for a conventional SADP process.

FIG. 3 illustrates the operation of a line end keep out rule for a conventional SADP process. An additional consideration in the placement and routing of metal routes is the minimum feature size (also referred to as critical dimension (CD)) of the block masking process. The line ends of a metal route cannot be closer than the minimum feature size of the block masking process. Thus, for instance, a router ensures that line ends 301 and 303 remain outside the bounds of keep out area 305. Specifically, the router requires line ends 301 and 303 to have minimum separation distance 307.

Figure 4A:
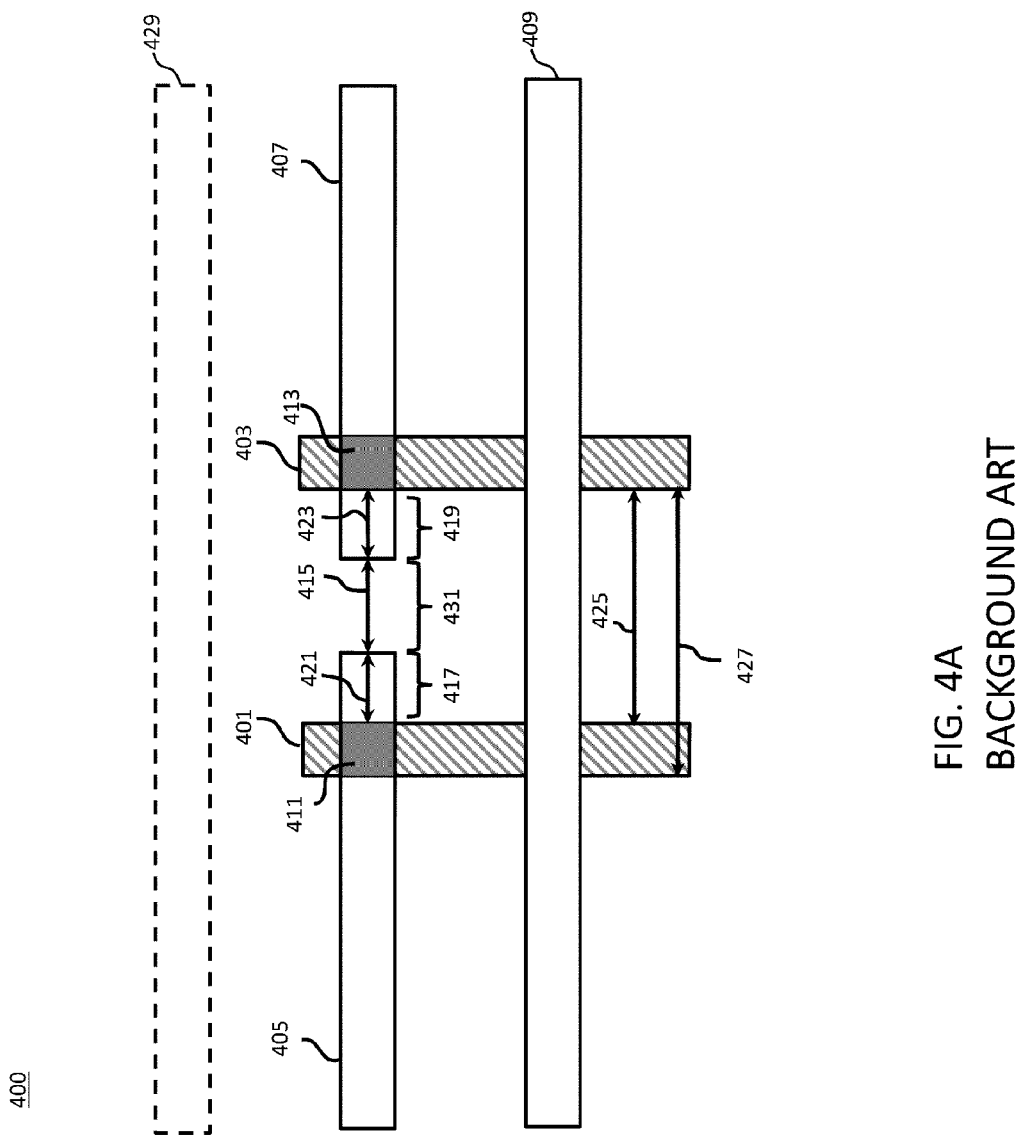
FIGS. 4A and 4B illustrate an illegal configuration under conventional SADP process rules.

FIG. 4A illustrates illegal routing configuration 400 that is illegal under conventional SADP process rules. SADP may be used to form the depicted metal routes. As illustrated, metal routes 401 and 403 may belong to an M1 layer, and metal route segments 405 and 407 and metal route 409 may belong to an M2 layer. VIA 411 connects metal route segment 405 to meta route 401, and VIA 413 connects metal route segment 407 to metal route 403. Having VIAs 411 and 413 along the same metal track (i.e., connected to metal route segment 405 and 407) is desirable because such a configuration produces an efficient routing structure.

However, configuration 400 must simultaneously satisfy a keep out rule, a VIA enclosure rule, and a minimum feature size for block masking. For instance, separation distance 415 between line ends 417 and 419 cannot be smaller than a minimum feature size of a block masking process. Furthermore, lengths 421 and 423 of line ends 417 and 419, respectively, cannot be shorter than a VIA enclosure distance associated with VIAs 411 and 413. A conventional routing process will also enforce separation distance 425 based on metal pitch 427.

Because of the general process of forming the M2 layer by SADP, another metal route 429 would be formed above the metal route segments 405 and 407, as illustrated by the dashed line. However, assuming routing within the M2 layer does not require the metal route 429, the metal route 429 is omitted from the routing of the M2 layer by adding a block mask such that when the M2 layer is formed, the metal route 429 is prevented from being formed. Based on the processes of determining the routing layer, the same block mask used to prevent formation of the metal route 429 is also used to form the gap 431 between the metal route segments 405 and 407.

Depending on the values with respect to one or more of the separation distance 415, lengths 421 and 423, and separation distance 425, proximity and separation constraints make configuration 400 illegal under a conventional routing process. Inner vertices required for a block mask to form the M2 layer may cause a violation of one or more of the keep out rule, VIA enclosure rule, and minimum feature size for block masking.

Figure 4B:
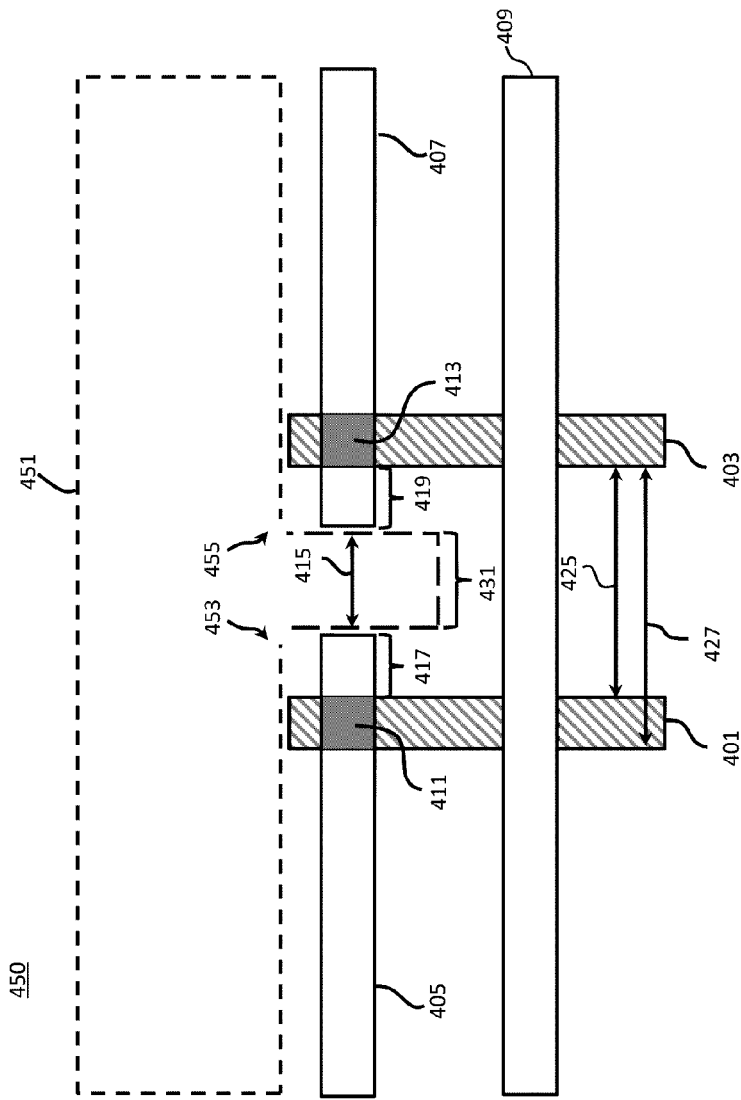

For instance, FIG. 4B illustrates a block mask 451 that may be used in forming the configuration illustrated in FIG. 4A to create the gap 431 between metal route segments 405 and 407 and to prevent the formation of the metal route 429. Depending on the values with respect to one or more of the separation distance 415, lengths 421 and 423, and separation distance 425 illustrated in FIG. 4A, a conventional router may be unable to create configuration 450 because inner vertices 453 and 455 trigger a loose enclosure rule at line ends 417 and 419. The configuration 450 may be illegal because separation distance 425 is unable to accommodate line ends 417, 419, and separation distance 415.

For example, separation distance 415 (corresponding to a minimum feature size of block mask 451) may be between 45 and 50 nm and the minimum threshold value for a loose enclosure rule may be between 25 and 30 nm. Separation distance 425 may be determined based on a metal pitch and metal width of the SADP process. For instance, assuming a metal pitch of 48 nm and a default metal width of 22 nm, separation distance 425 may be obtained by subtracting the metal width from twice the metal pitch ((2×48)−22=74 nm). Configuration 450 is determined to be illegal because the sum (95 nm) of the minimum threshold values for the loop enclosure (25 nm) and keep out (45 nm) rules clearly exceeds 74 nm.

Figure 5:
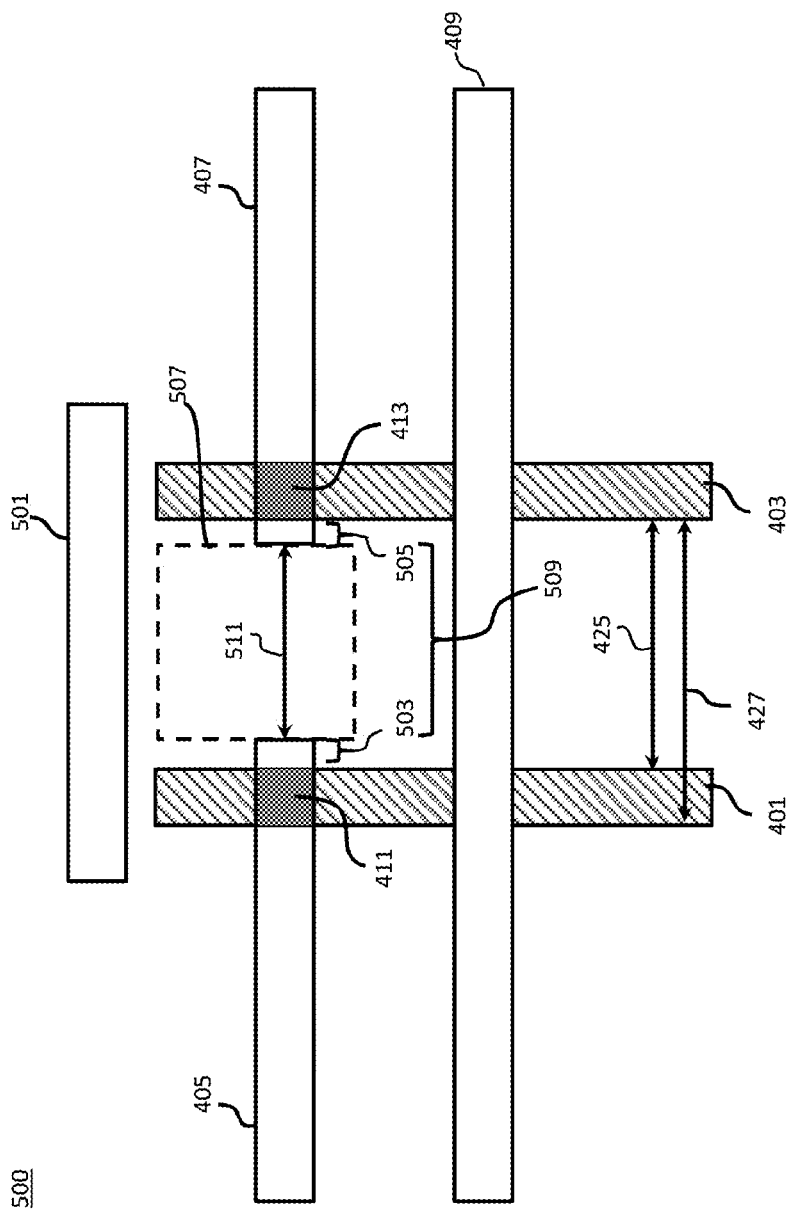
FIG. 5 illustrates an assisted routing, in accordance with an exemplary embodiment of the present disclosure.

FIG. 5 illustrates an assisted routing that legalizes the configuration illustrated in FIGS. 4A and 4B, according to an exemplary embodiment of the present disclosure. Assisted configuration 500 is legalized by placement of assistant metal portion 501 above metal route segments 405 and 407. Assistant metal portion 501 may be a portion of a metal route (e.g., metal route 429) that is within the same metal layer (e.g., M2 layer) that the metal route segments 405 and 407 belong to. Unlike the configuration in FIG. 4A, assisted configuration 500 does not trigger a loose loop enclosure rule at line ends 503 and 505 because the assistant metal portion 501 prevents the use of block mask 451 illustrated in FIG. 4B, which includes the inner vertices 453 and 455. Rather, rectangular block mask 507 can be used to form the gap 509 between line ends 503 and 505. As a result, the length of line ends 503 and 505 can be reduced while still satisfying a VIA enclosure rule, and the separation distance 511 can satisfy the keep out rule and minimum feature size for block masking. Accordingly, assistant metal portion 501 allows assisted configuration 500 to pass SADP process rules.

Figure 6:
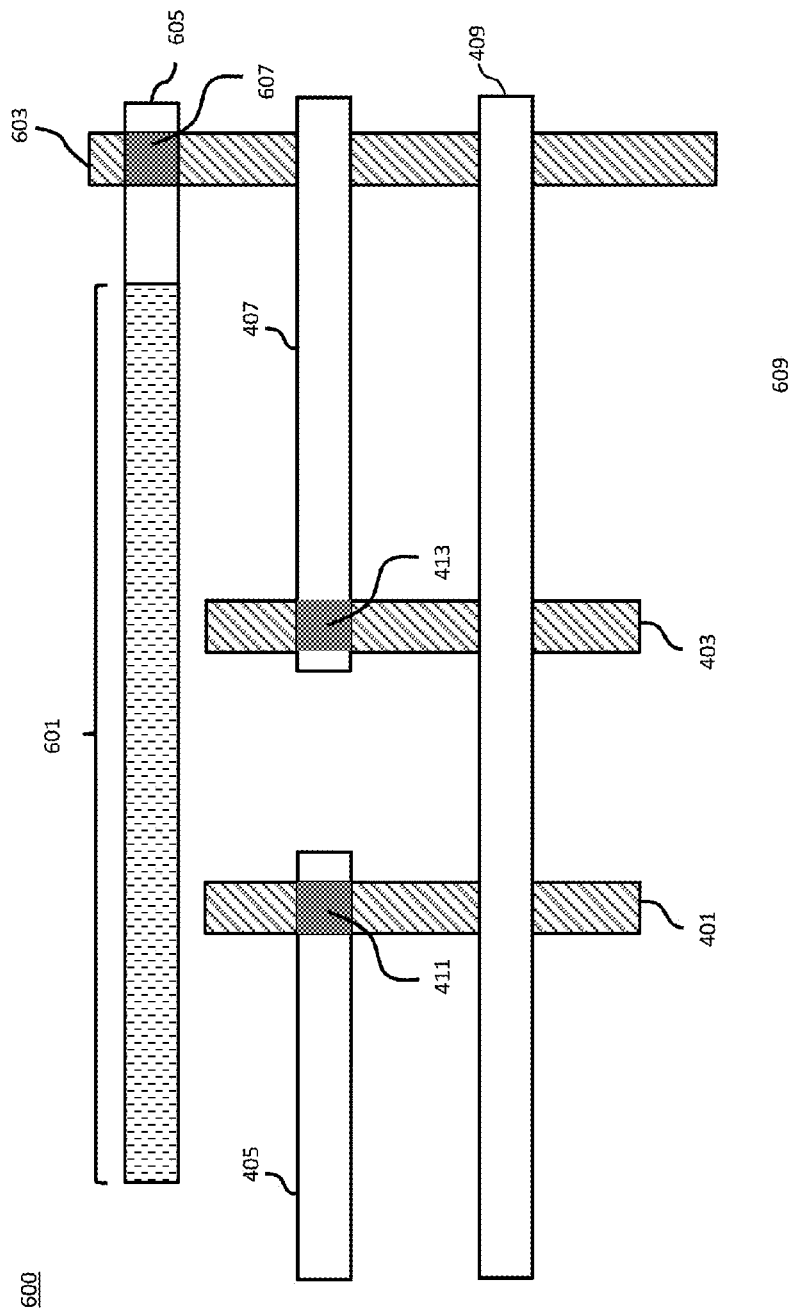
FIG. 6 illustrates a configuration with an extension of an assistant metal portion, in accordance with an exemplary embodiment of the present disclosure.

FIG. 6 illustrates configuration 600 utilizing an assistant metal portion 601, according to an exemplary embodiment of the present disclosure. FIG. 6 may illustrates a wider perspective of the view illustrated in FIG. 5, which illustrates additional metal route 603, which may be part of the M1 layer, and metal route 605, which may be part of the M2 layer. The length of assistant metal portion 501 illustrated in FIG. 5 may be increased to form assistant metal portion 601, such that assistant metal portion 601 may connect to metal route 605 and be utilized for routing within the M2 layer and/or reduce the complexity of block mask geometries required for forming the M2 layer depending on the layout and connection requirements of the M2 layer. For example, assistant metal portion 601 may be used to route VIA 607 in addition to being used to legalize violations associated with VIAs 411 and 413.

Figure 7:
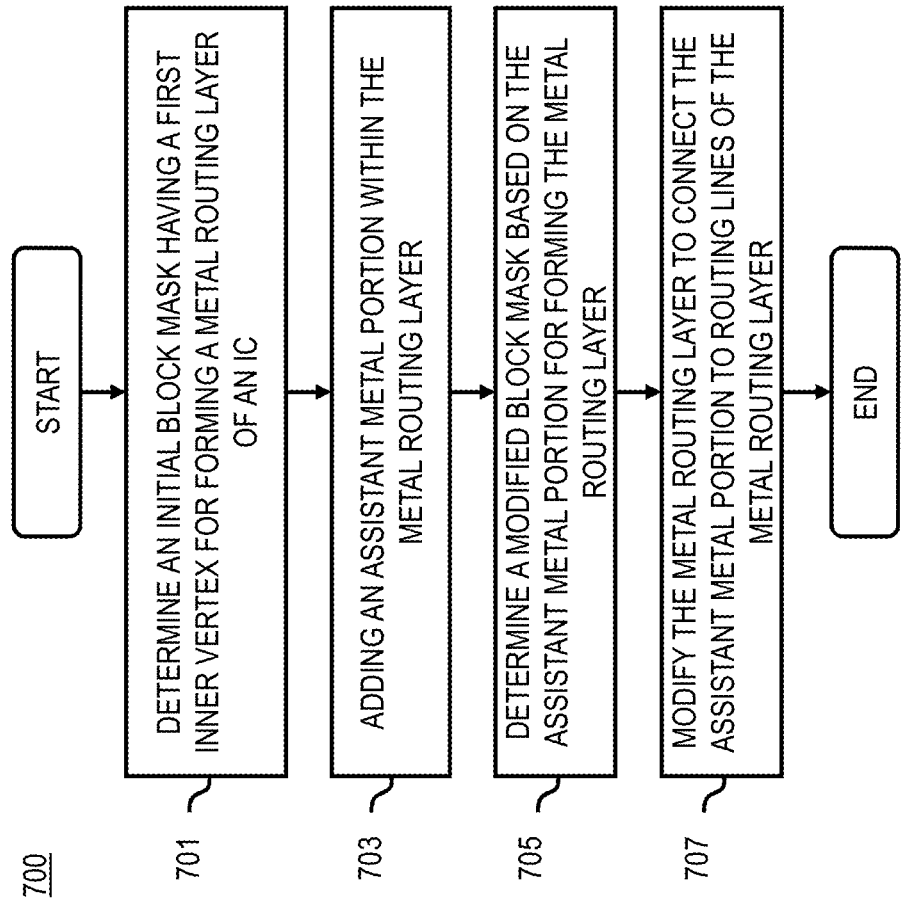
FIG. 7 illustrates a process flow for an assisted metal routing, in accordance with an exemplary embodiment of the present disclosure.
Figure 8:
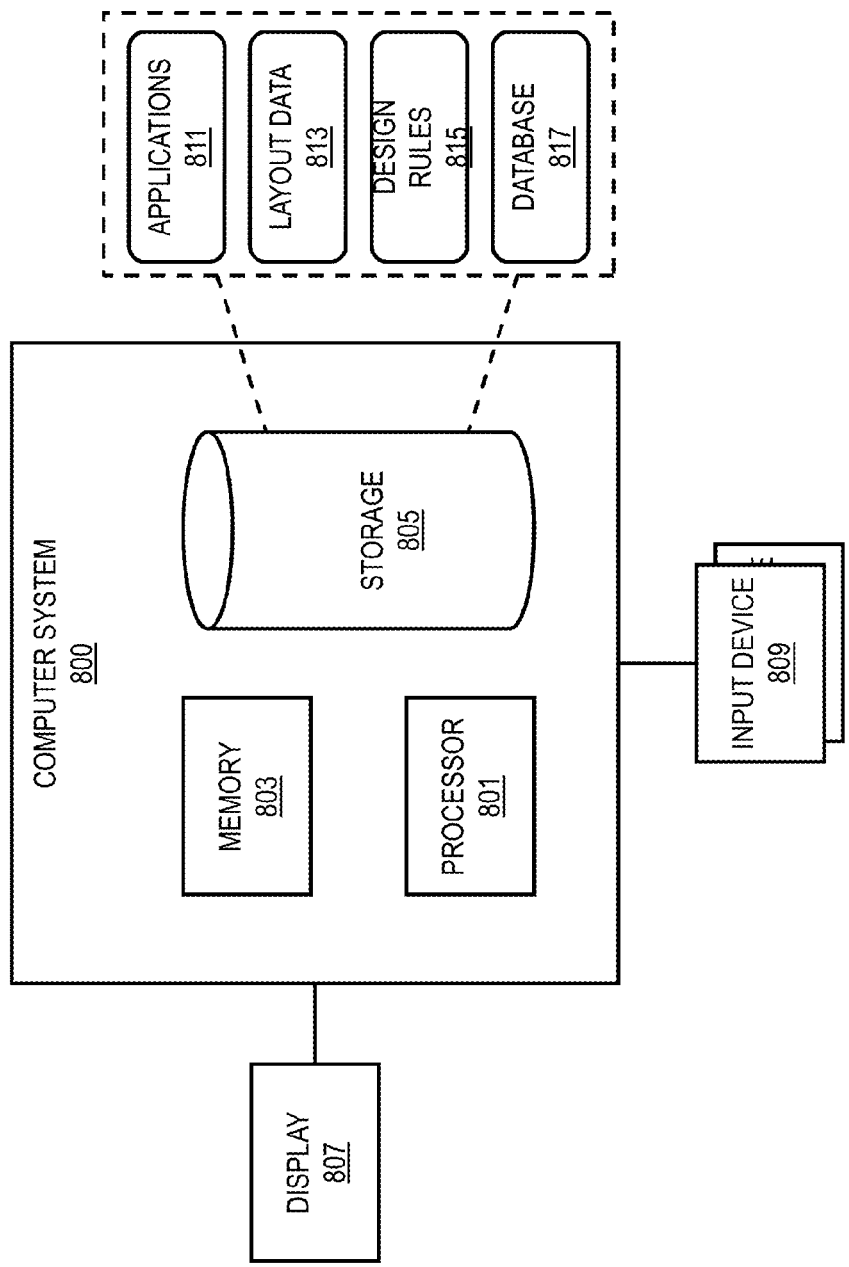
FIG. 8 illustrates a computer system for implementing an assisted routing, in accordance with an exemplary embodiment of the present disclosure.

FIG. 7A illustrates a process flow 700 for an assisted metal routing, in accordance with an exemplary embodiment of the present disclosure. The process 700 may be implemented in, for instance, a chip set including a processor and a memory as shown in FIG. 8. In step 701, an initial block mask having a first inner vertex for forming a metal routing layer of an IC is determined. Step 701 may include determining a routing violation associated with the first inner vertex of the initial block mask. As described above, the routing violation may be based on one or more of a keep out rule, a VIA enclosure rule, and a minimum feature size for block masking. Further, the first inner vertex may be correspond with forming a first end line of the metal routing layer. Further, a VIA connection may be at the first line end. Additionally, step 701 may include determining a second line end of the metal routing layer within a same track as the first line end, and determining a second VIA connection to the metal routing layer at the second line end.

In step 703, an assistant metal portion is added within the metal routing layer. The adding of the assistant metal portion is based on the routing violation. The assistant metal portion may be added to a metal track adjacent to the first line end described above.

In step 705, a modified block mask based on the assistant metal portion is determined for forming the metal routing layer. The modified block mask satisfies the routing violation based on the addition of the metal routing portion. In which case, the modified block mask may satisfy a routing violation of the metal routing layer with respect to the first VIA connection. The modified block mask may also satisfy a routing violation of the metal routing layer between the first VIA connection and the second VIA connection.

The process flow 700 may also include step 707, in which the metal routing layer is modified to connect the assistant metal portion to routing lines of the metal routing layer. As described in relation to FIG. 6, the assistant metal portion may be integrated within the routing of the metal routing layer, such as to provide routing resources for other VIA connections.

The processes described herein may be implemented via software, hardware, firmware, or a combination thereof. Exemplary hardware (e.g., computing hardware) is schematically illustrated in FIG. 8. As shown, computer system 800 includes at least one processor 801, at least one memory 803, and at least one storage 805. Computer system 800 may be coupled to display 807 and one or more input devices 809, such as a keyboard and a pointing device. Display 807 may be utilized to provide one or more GUI interfaces. Input devices 809 may be utilized by users of computer system 800 to interact with, for instance, the GUI interfaces. Storage 805 may store applications 811, layout data (or information) 813, design rules 815, and at least one shape and/or cell database (or repository) 817. Applications 811 may include instructions (or computer program code) that when executed by processor 801 cause computer system 800 to perform one or more processes, such as one or more of the processes described herein. In exemplary embodiments, applications 811 may include one or more manufacturability analysis and/or yield enhancement tools.

The embodiments of the present disclosure can achieve several technical effects, including legalizing efficient routing configurations. The present disclosure enjoys industrial applicability associated with the designing and manufacturing of any of various types of highly integrated semiconductor devices used in microprocessors, smart phones, mobile phones, cellular handsets, set-top boxes, DVD recorders and players, automotive navigation, printers and peripherals, networking and telecom equipment, gaming systems, and digital cameras, particularly for 10 nm technologies and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    determining an initial block mask having a first inner vertex for forming a metal routing layer of an integrated circuit (IC);
    adding an assistant metal portion within the metal routing layer;
    determining a modified block mask based on the assistant metal portion for forming the metal routing layer;
    determining a first line end of the metal routing layer;
    determining a first VIA connection to the metal routing layer at the first line end determining a second line end of the metal routing layer within a same track as the first line end;
    determining a second VIA connection to the metal routing layer at the second line end; and
    modifying the metal routing layer to connect the assistant metal portion to routing lines of the metal routing layer, the assistant metal portion providing a routing resource for a third VIA connection,
    wherein the first inner vertex of the initial block mask corresponds to forming the first line end,
    wherein the modified block mask satisfies a routing violation of the metal routing layer with respect to the first VIA connection, and
    wherein the modified block mask satisfies a routing violation of the metal routing layer between the first VIA connection and the second VIA connection.

2. The method according to claim 1, further comprising:
    determining a routing violation associated with the first inner vertex of the initial block mask,
    wherein the adding of the assistant metal portion is based on the routing violation.

3. The method according to claim 2, wherein the routing violation is based on one or more of a keep out rule, a vertical interconnect access (VIA) enclosure rule, and a minimum feature size for block masking.

4. The method according to claim 1, wherein the assistant metal portion is added to a metal track adjacent to the first line end.

5. An apparatus comprising:
    at least one processor; and
    at least one memory including computer program code for one or more programs,
    the at least one memory and the computer program code configured to, with the at least one processor, cause the apparatus to perform at least the following:
    determine an initial block mask having a first inner vertex to form a metal routing layer of an integrated circuit (IC);

add an assistant metal portion within the metal routing layer;
determine a modified block mask based on the assistant metal portion for forming the metal routing layer;
determine a first line end of the metal routing layer;
determine a first VIA connection to the metal routing layer at the first line end;
determine a second line end of the metal routing layer within a same track as the first line end;
determine a second VIA connection to the metal routing layer at the second line end; and
modify the metal routing layer to connect the assistant metal portion to routing lines of the metal routing layer, the assistant metal portion providing a routing resource for a third VIA connection,
wherein the first inner vertex of the initial block mask corresponds to forming the first line end,
wherein the modified block mask satisfies a routing violation of the metal routing layer with respect to the first VIA connection, and
wherein the modified block mask satisfies a routing violation of the metal routing layer between the first VIA connection and the second VIA connection.

6. The apparatus according to claim 5, wherein the apparatus is further caused to:
determine a routing violation associated with the first inner vertex of the initial block mask,
wherein the adding of the assistant metal portion is based on the routing violation.

7. The apparatus according to claim 6, wherein the routing violation is based on one or more of a keep out rule, a vertical interconnect access (VIA) enclosure rule, and a minimum feature size for block masking.

8. The apparatus according to claim 5, wherein the assistant metal portion is added to a metal track adjacent to the first line end.

9. A method comprising:
determining a configuration of a metal routing layer of an integrated circuit (IC) that would cause a routing violation;
adding an assistant metal portion to the metal routing layer;
determining a block mask based on the assistant metal portion for forming the metal routing layer that satisfies the routing violation; and
modifying the metal routing layer to connect the assistant metal portion to routing lines of the metal routing layer,
wherein the routing violation is associated with a block mask inner vertex at an line end of the metal routing layer including a vertical interconnect access (VIA) connection,
wherein the assistant metal portion provide a routing resource for the VIA connection.

10. The method according to claim 9, wherein the routing violation is based on one or more of a keep out rule, a VIA loop enclosure rule, and a minimum feature size for block masking.

* * * * *